(12) United States Patent
Dover et al.

(10) Patent No.: US 7,386,654 B2
(45) Date of Patent: Jun. 10, 2008

(54) NON-VOLATILE CONFIGURATION DATA STORAGE FOR A CONFIGURABLE MEMORY

(75) Inventors: Lance W. Dover, Fair Oaks, CA (US);
Chaitanya S. Rajguru, Bangalore (IN);
Robert E. Larsen, Placerville, CA (US)

(73) Assignee: Intel Corporation, Santa Clara, CA (US)

( * ) Notice: Subject to any disclaimer, the term of this patent is extended or adjusted under 35 U.S.C. 154(b) by 448 days.

(21) Appl. No.: 10/966,183

(22) Filed: Oct. 15, 2004

(65) Prior Publication Data
US 2006/0083093 A1    Apr. 20, 2006

(51) Int. Cl.
*G06F 12/00* (2006.01)
(52) U.S. Cl. .................. 711/103; 711/104; 711/105; 711/154; 711/170; 713/1; 713/2
(58) Field of Classification Search ............. 711/103, 711/104, 105, 154, 170; 713/1, 2
See application file for complete search history.

(56) References Cited

U.S. PATENT DOCUMENTS

| 4,758,745 | A | * | 7/1988 | Elgamal et al. ............... 326/16 |
| RE34,363 | E | * | 8/1993 | Freeman ....................... 326/38 |
| 5,243,238 | A | * | 9/1993 | Kean ............................ 326/41 |
| 5,453,706 | A | * | 9/1995 | Yee .............................. 326/93 |
| 5,566,127 | A | * | 10/1996 | Hoshizaki .............. 365/230.06 |
| 5,572,482 | A | * | 11/1996 | Hoshizaki et al. .......... 365/233 |
| 5,787,007 | A | * | 7/1998 | Bauer .......................... 716/16 |
| 5,933,023 | A | * | 8/1999 | Young .......................... 326/40 |
| 6,085,278 | A | * | 7/2000 | Gates et al. ................. 710/263 |
| 6,480,948 | B1 | * | 11/2002 | Virajpet et al. ............. 711/202 |
| 6,522,167 | B1 | * | 2/2003 | Ansari et al. ................. 326/39 |
| 6,711,059 | B2 | * | 3/2004 | Sinclair et al. ......... 365/185.11 |
| 6,895,452 | B1 | * | 5/2005 | Coleman et al. ............. 710/22 |
| 6,938,127 | B2 | * | 8/2005 | Fletcher et al. ............. 711/141 |
| 7,000,165 | B1 | * | 2/2006 | Asson et al. ................ 714/733 |
| 2004/0064599 | A1 | * | 4/2004 | Jahnke et al. ................. 710/14 |

OTHER PUBLICATIONS

Tanenbaum, "Structured Computer Organization, Third Edition," Section 1.4, "Hardware, Software, and Multilevel Machines," p. 11, lines 19-27, 1990.*

* cited by examiner

*Primary Examiner*—Stephen Elmore
(74) *Attorney, Agent, or Firm*—John F. Travis

(57) ABSTRACT

Various embodiments of the invention may provide one or more non-volatile storage entities, such as a register or a storage array, to store configuration information for a memory device. The specified configuration may then be enabled at the occurrence of a specified event, such as power-up and/or reset.

11 Claims, 5 Drawing Sheets

NON-VOLATILE CONFIGURATION DATA STORAGE FOR A CONFIGURABLE MEMORY

BACKGROUND

Some memory devices, such as flash memory devices, may operate in a variety of interface modes (e.g., synchronous, asynchronous, etc.), and may have other features that are configurable. Different end users may require different interface modes and/or different configurations of the various features. To avoid having to manufacture different memory products for every different configuration need, this configurability is frequently provided by having volatile configuration registers into which the correct configuration data may be written while the system is powered, but before the memory is to be used. Although the content of these registers may be retained as long as power is applied to the device, the configuration registers must be rewritten at each power-on or reset. Doing so may require a special boot sequence and/or special hardware support.

BRIEF DESCRIPTION OF THE DRAWINGS

The invention may be understood by referring to the following description and accompanying drawings that are used to illustrate embodiments of the invention. In the drawings.

DETAILED DESCRIPTION OF THE INVENTION

Figure 1:
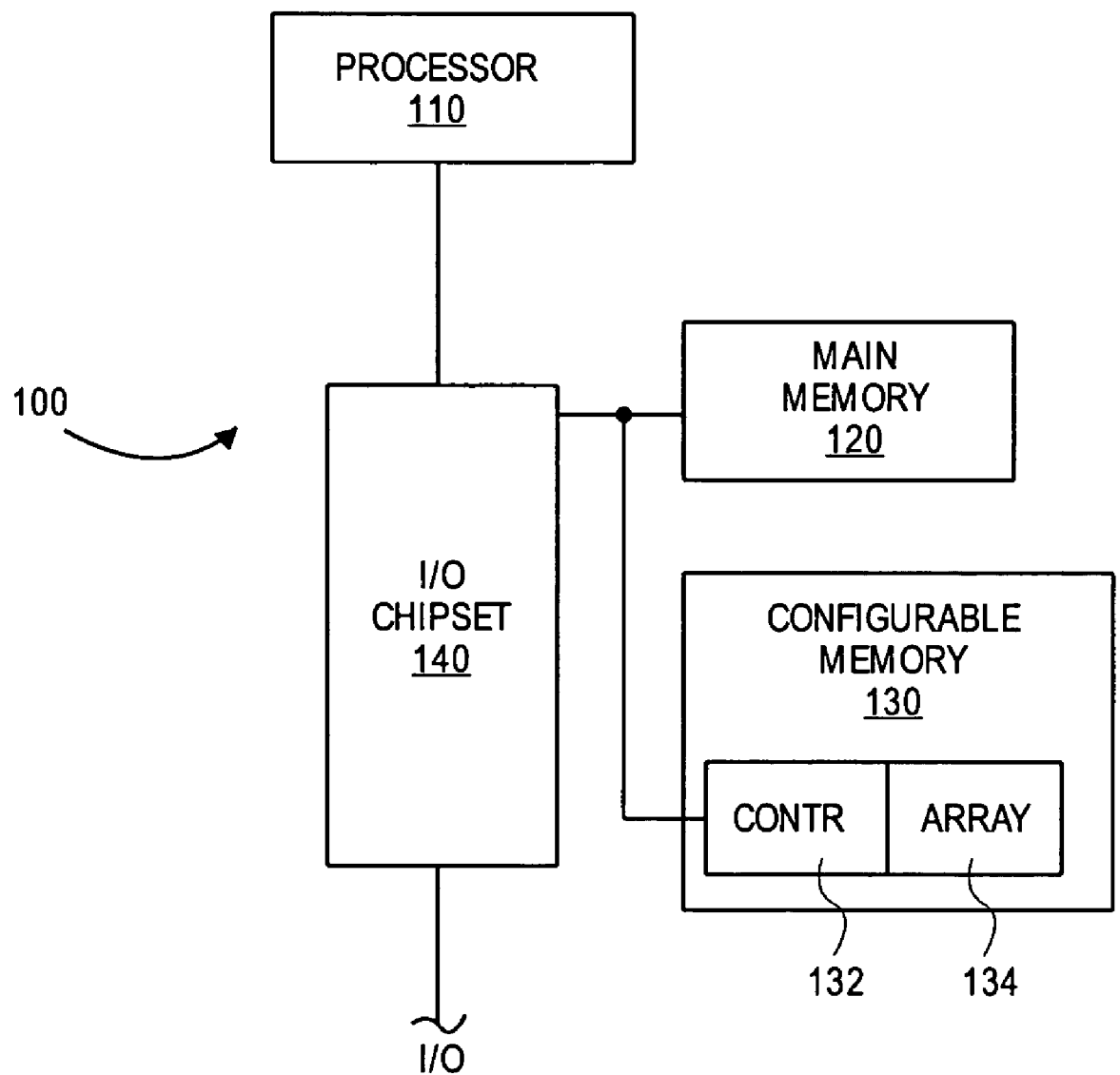
FIG. 1 shows a block diagram of a system comprising a configurable memory with non-volatile storage of the configuration data, according to an embodiment of the invention.

In the following description, numerous specific details are set forth. However, it is understood that embodiments of the invention may be practiced without these specific details. In other instances, well-known circuits, structures and techniques have not been shown in detail in order not to obscure an understanding of this description.

References to "one embodiment", "an embodiment", "example embodiment", "various embodiments", etc., indicate that the embodiment(s) of the invention so described may include a particular feature, structure, or characteristic, but not every embodiment necessarily includes the particular feature, structure, or characteristic. Further, the different embodiments described my have some, all, or none of the features described for other embodiments.

In the following description and claims, the terms "coupled" and "connected," along with their derivatives, may be used. It should be understood that these terms are not intended as synonyms for each other. Rather, in particular embodiments, "connected" may be used to indicate that two or more elements are in direct physical or electrical contact with each other. "Coupled" may mean that two or more elements co-operate or interact with each other, but they may or may not be in direct physical or electrical contact.

The term "processor" may refer to any device or portion of a device that processes electronic data from registers and/or memory to transform that electronic data into other electronic data that may be stored in registers and/or memory. A "computing platform" may comprise one or more processors.

As used herein, unless otherwise specified the use of the ordinal adjectives "first", "second", "third", etc., to describe a common object, merely indicate that different instances of like objects are being referred to, and are not intended to imply that the objects so described must be in a given sequence, either temporally, spatially, in ranking, or in any other manner.

The invention may be implemented in one or a combination of hardware, firmware, and software. The invention may also be implemented as instructions stored on a machine-readable medium, which may be read and executed by a computing platform to perform the operations described herein. A machine-readable medium may include any mechanism for storing or transmitting information in a form readable by a machine (e.g., a computer). For example, a machine-readable medium may include read only memory (ROM); random access memory (RAM); magnetic disk storage media; optical storage media; flash memory devices; electrical, optical, acoustical or other form of propagated signals (e.g., carrier waves, infrared signals, digital signals, etc.), and others.

Various embodiments of the invention may provide one or more non-volatile storage elements to store configuration information for a memory device. In some embodiments these non-volatile storage elements may be programmable only at the factory, while in other embodiments these configuration registers may be programmable by others (e.g., during subsequent manufacturing and/or assembly and/or distribution and/or sales operations), or even by the end user. Non-volatile circuit elements are considered to be circuit elements that do not lose their data contents when power is removed from the circuit, while volatile circuit elements are considered to be circuit elements that do lose their data contents when electrical power is removed from the circuit.

FIG. 1 shows a block diagram of a system comprising a configurable memory with non-volatile storage of the configuration data, according to an embodiment of the invention. In the illustrated system 100, processor 110 may be coupled to memories 120 and 130. The system may contain one or more input/output (I/O) chips 140 to pass control, data, address, and possibly other signals between the processor and memory devices, as well as to/from other I/O devices, though various embodiments may not be limited in this manner. The memories may comprise a main memory 120, such as but not limited to a dynamic random access memory (DRAM) and/or static random access memory (SRAM), and may also contain a configurable memory 130 comprising a controller 132 and a memory array 134. In some embodiments the configurable memory 130 may be contained within a single integrated circuit, although in other embodiments multiple such integrated circuits may be used in the same system 100 to increase memory capacity. Some embodiments may employ multiple configurable memories 130, and each configurable memory may use the same or a different configuration as the other configurable memories. In some embodiments the entire memory may be implemented as configurable memory, so that configurable memory 130 becomes main memory, replacing the illustrated memory 120.

In some embodiments the configurable memory may be a non-volatile memory, such as but not limited to flash memory, though in other embodiments the same configuration techniques may be used for volatile memories. The configurable memory may be a memory that can be configured to operate in various ways, depending on configuration data contained in controller 132. The configuration data may specify operational configuration parameters for configurable memory 130, such as but not limited to: 1) synchronous or asynchronous interface operation, 2) the number of wait states to be observed on the memory bus when wait states are necessary, 3) the polarity (assertion state) of one or more control signals, 4) the polarity of one or more interrupt signals, 5) the width of data increments that may be written to and/or read from the memory at one time, and 6) which power modes may be used in the memory. As many bits as necessary may be reserved in appropriate storage to store the needed configuration data.

Figure 2:
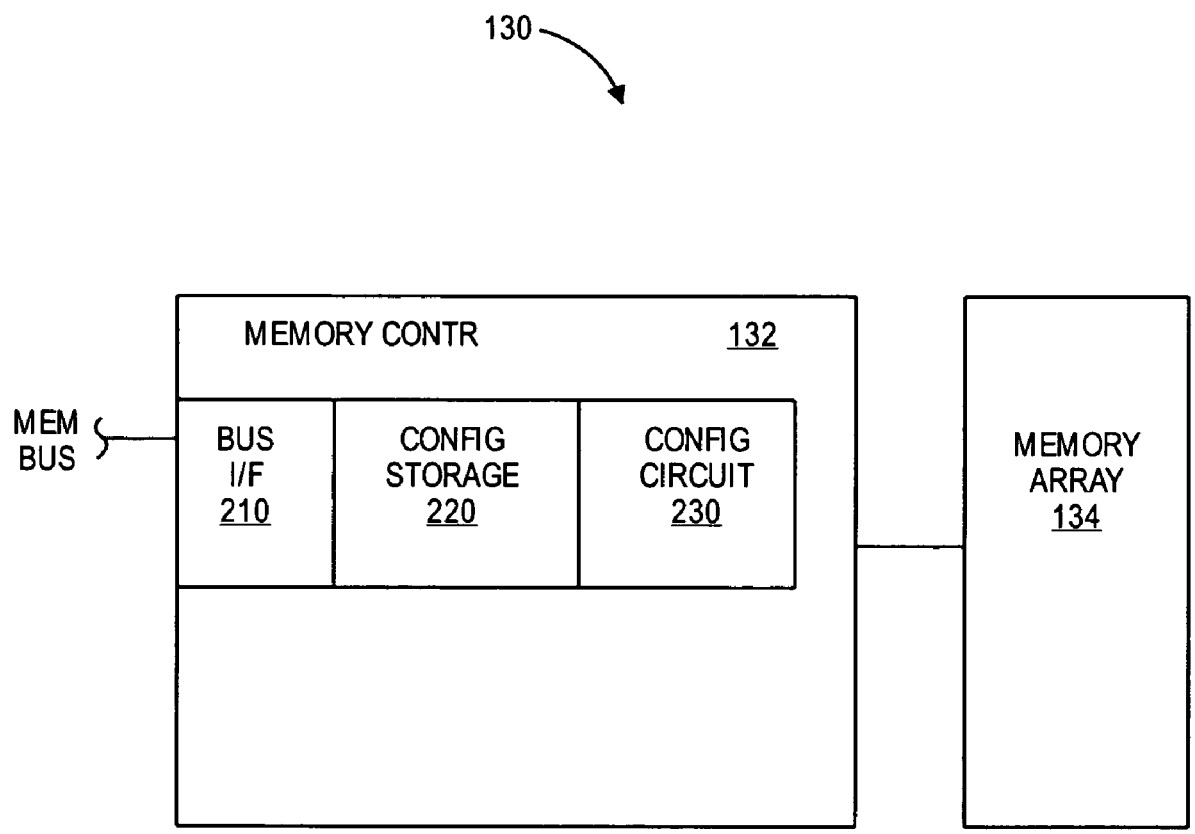
FIG. 2 shows a block diagram of at least a portion of a configurable memory, according to an embodiment of the invention.

FIG. 2 shows a block diagram of at least a portion of a configurable memory, according to an embodiment of the invention. In the illustrated embodiment, configurable memory 130 comprises memory controller 132 and memory array 134 as indicated in FIG. 1. Memory array 134 may contain an array of storage cells, the contents of which may be read and/or written according to the addressing scheme implemented in that memory.

In FIG. 2, the memory controller 132 may comprise a bus interface 210 to transfer various signals to/from the memory bus (including signals representing memory configuration data), a configuration storage circuit 220 to store the configuration data received over the memory bus, and a configuration circuit 230 to convert the configuration data in configuration storage circuit 220 into signals that cause the memory to operate in a manner specified by the configuration data. The memory controller 132 may also have other circuitry not described herein.

Figure 3:
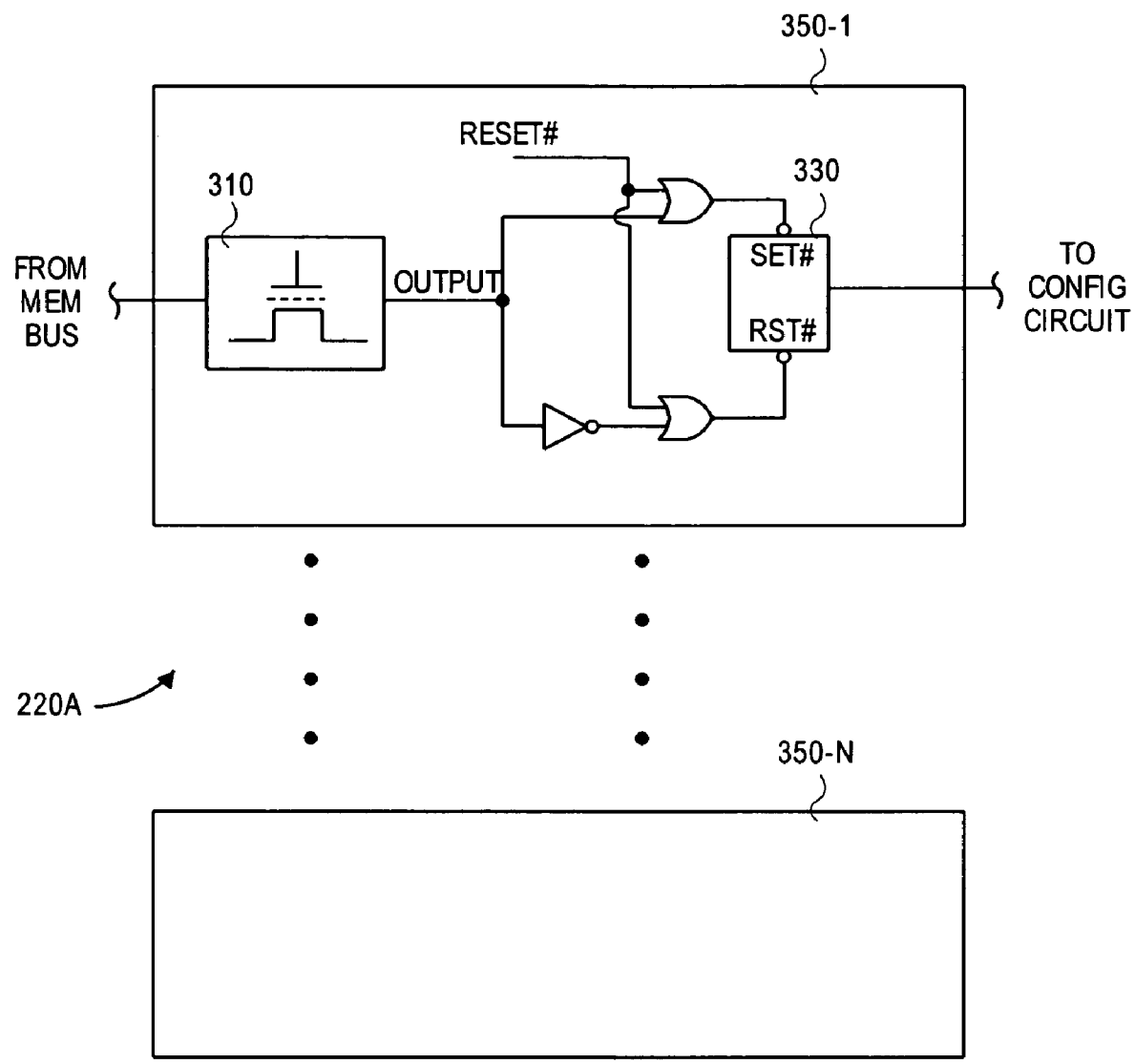
FIG. 3 shows a block diagram of a configuration storage circuit, according to an embodiment of the invention.

FIG. 3 shows a block diagram of a configuration storage circuit, according to an embodiment of the invention. In the illustrated embodiment of the configuration storage circuit (labeled 220A to distinguish it from another embodiment 220B shown in FIG. 4), multiple storage cells 350-1 through 350-n may be used to store the bits representing configuration data in a non-volatile manner, and to present those bits to the configuration circuit 230. Configuration storage circuit 220A may include as many single-bits circuits 350 as needed to hold the configuration data, but for simplicity only one is illustrated.

Circuits 350-x may each include a single-bit non-volatile storage cell 310, which may be written into at selected times. Although a single-transistor storage cell is shown, other embodiments may include two or more transistors in each single-bit storage cell 310. As many storage cells 310 may be included as are needed to hold all the configuration bits needed to properly configure the memory. In some embodiments, multiple storage cells 310 may be organized as one or more registers, in which all storage cells in the register may be written into at the same time, depending on the memory bus width and other factors (e.g., with a 16-bit memory data bus, 16 storage cells 310 in a 16-bit register might be written into simultaneously with a single 16-bit transfer on the memory bus). If there are too many storage cells 310 for a single write operation, multiple write operations may be needed.

The output of each storage cell 310 may then be provided to a volatile storage cell, which may load the output of storage cell 310 upon the occurrence of a particular signal. In the example shown, assertion of signal RESET# (the # indicates the signal is asserted when it is low) may cause the output of non-volatile storage cell 310 to be loaded into flipflop 330, which will maintain that state until the next reset operation or until power is removed from the circuit. The output of flipflop 330 may then be connected to the configuration circuit 230, where it may be used to cause the memory to operate in the indicated manner.

In some embodiments the output state of non-volatile storage cell 310 may be fed directly to configuration circuit 230, without using an intermediate volatile storage cell 330. However, some non-volatile storage techniques require the use of special voltages that are only used to read (and possibly write) the non-volatile storage circuits. In such cases, continuously maintaining the output of the non-volatile storage cell might require the addition of expensive continuously-available power supply circuits rather than the use of inexpensive on-demand charge pumps for these voltages. Also, using a volatile storage element in addition to the non-volatile storage element may permit the configuration to be temporarily changed, while still retaining the original configuration information. Thus, in some embodiments, including the volatile flip flop circuitry may be preferable to including additional power supplies.

Figure 4:
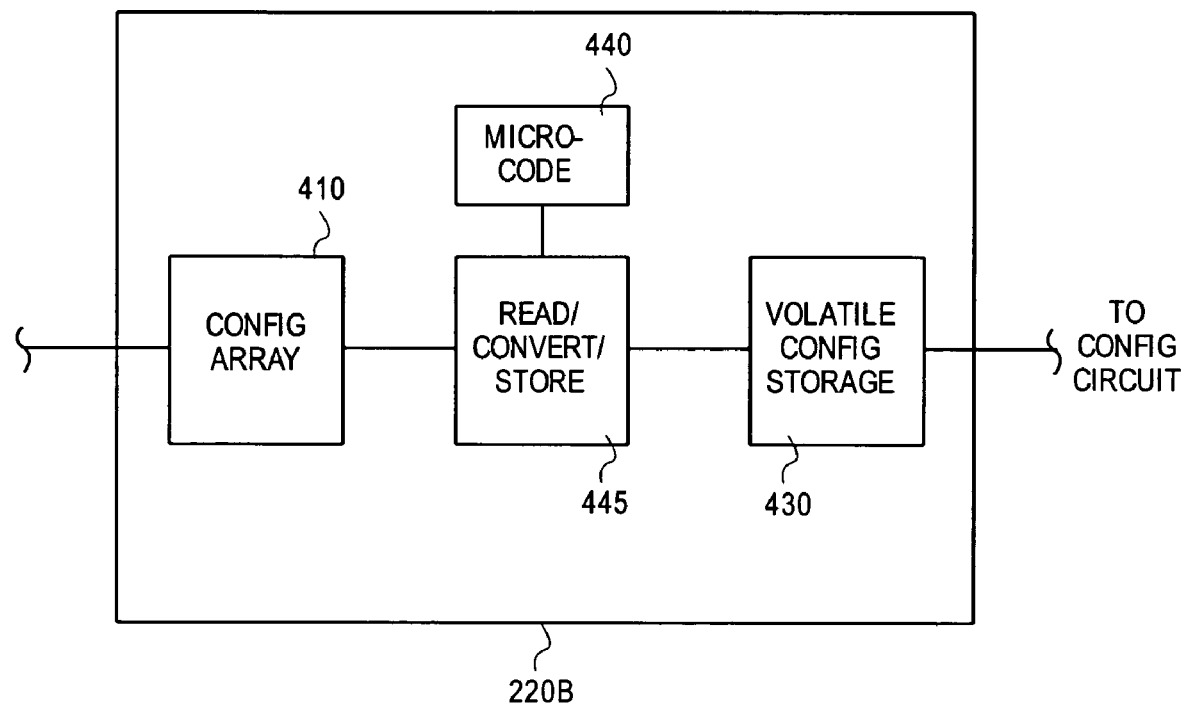
FIG. 4 shows a block diagram of a configuration storage circuit, according to another embodiment of the invention.

FIG. 4 shows a block diagram of a configuration storage circuit, according to another embodiment of the invention. In the illustrated embodiment of configuration storage circuit 220B, a non-volatile storage array 410 may be used rather than the non-volatile register(s) shown in FIG. 3. In storage arrays, storage cells are typically arranged in an X-Y matrix, and typically only a small portion of the storage cells may be accessed at one time, based on an address presented to the array, and a sense operation of some type may be used to sense the contents of the cells selected by that address. By contrast, in a register the contents of every storage cell in the register may be available at one time, and may even be available continuously without need for a selection address, although various embodiments of the invention may not be limited in this manner. Since only selected portions of an array may present their outputs at one time, a read/convert/store circuit 445 may be used to address a portion of the non-volatile configuration array, read the bits in the addressed portion, place those bits in the proper place in volatile configuration storage 430, and repeat until all the needed configuration bits have been stored in volatile configuration storage 430, thereby converting data in a matrix format into data in a register format. Micro-code 440 may be executed to direct the read/convert/store circuit in this operation. Volatile configuration storage 430 may be similar to the multiple flipflops 330 shown in FIG. 3, so that all configuration bits will be available to configuration circuit 230 at one time.

The embodiment of FIG. 4 may be preferable when the number of configuration bits is so large that it makes an array preferable to many individual non-volatile storage cells in parallel. The embodiment of FIG. 4 may also permit multiple configurations to be stored in the non-volatile array, and a single circuit for micro-code 440 and read/convert/store 445 may be used sequentially for multiple memories, which may have different configurations.

Figure 5:
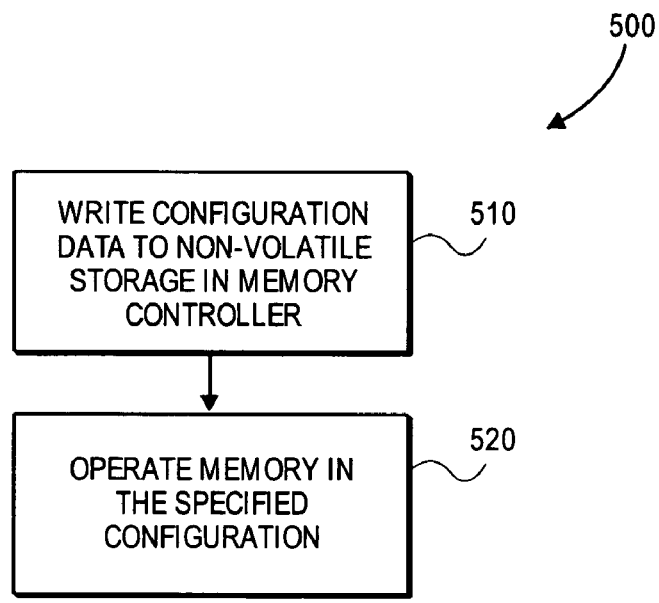
FIG. 5 shows a flow diagram of a method of writing configuration data, according to an embodiment of the invention.

FIG. 5 shows a flow diagram of a method of writing configuration data, according to an embodiment of the invention. In flow diagram 500, at 510 configuration data is written to non-volatile storage in a memory controller. In some embodiments, this configuration data may be written to the memory controller over the memory bus, either by using a special command or by writing to an address reserved for this purpose. In some embodiments this configuration data may subsequently be read from the non-volatile storage to volatile storage, from where it may be used to control the configuration in which the memory will operate. At 520 the memory may be operated in the specified configuration, using the configuration data in the memory controller.

Figure 6:
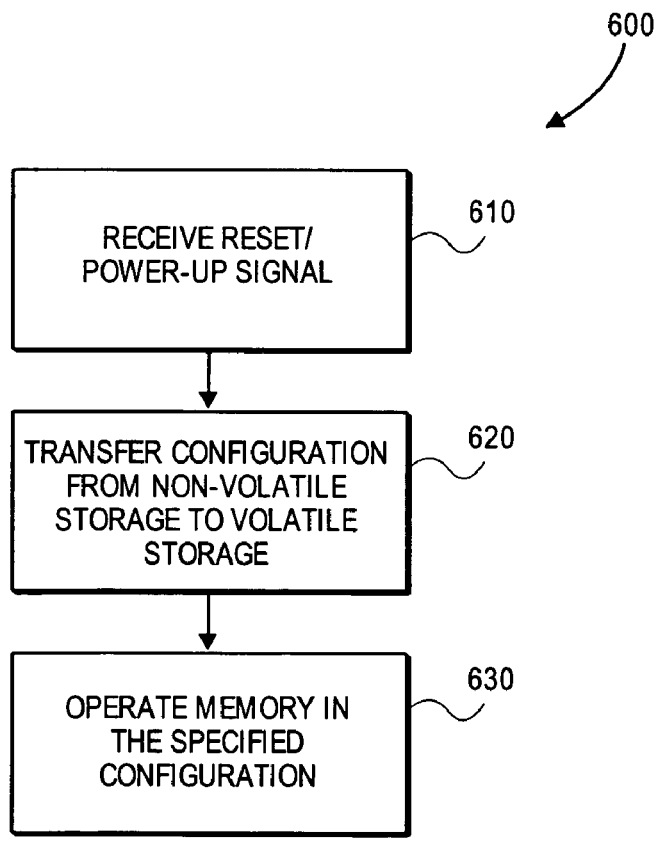
FIG. 6 shows a flow diagram of a method of loading configuration data after it is written, according to an embodiment of the invention.

FIG. 6 shows a flow diagram of a method of loading configuration data after it is written, according to an embodiment of the invention. In flow diagram 600, it is assumed that the configuration data has already been written into non-volatile storage. At 610 a signal is received indicating that the system is to be restarted. This signal may take the form of a reset signal or a power-up signal, although other types of signals may be used. Upon receipt of this signal, at 620 the configuration data in non-volatile storage may be loaded to volatile storage, from where the data may be used by configuration circuitry to cause the memory to operate in the specified configuration. In some embodiments this loading may be from a set of parallel non-volatile storage cells directly to a set of equivalent parallel volatile storage elements, such as flip-flops. In another embodiment this loading may encompass making multiple reads from a non-volatile storage array, and placing the data into a set of parallel storage elements. Other transfer techniques may also be used. At 630, the memory may be operated in the specified configuration.

The foregoing description is intended to be illustrative and not limiting. Variations will occur to those of skill in the art. Those variations are intended to be included in the various embodiments of the invention, which are limited only by the spirit and scope of the appended claims.

What is claimed is:

1. An apparatus comprising
a memory device comprising:
  a memory array; and
  a writable non-volatile storage element coupled to the memory array, the non-volatile storage element to hold contents defining operational configuration parameters of the memory device;
  wherein the non-volatile storage element comprises multiple non-volatile storage cells, an output of each non-volatile storage cell being coupled to an input of a volatile storage cell different than the volatile storage cells connected to other non-volatile storage cells.

2. The apparatus of claim 1, further comprising:
a volatile storage element; and
a circuit to store contents of at least a portion of the non-volatile storage element in the volatile storage element upon receipt of a particular signal.

3. The apparatus of claim 2, wherein:
the non-volatile storage element comprises a non-volatile storage array; and
the circuit comprises executable micro-code to read the contents from the non-volatile storage array and store the contents in the volatile storage element.

4. The apparatus of claim 1, wherein the non-volatile storage element comprises a non-volatile register.

5. The apparatus of claim 1, wherein the operational configuration parameters comprise indicators of at least one item selected from a list consisting of: 1) a synchronous or asynchronous interface, 2) number of wait states to be observed during operation, 3) polarity of a control signal, 4) width of data to be read at one time from the memory device, 5) polarity of an interrupt signal, and 6) power mode to be implemented.

6. The apparatus of claim 1, wherein the memory array comprises a non-volatile memory array.

7. The apparatus of claim 6, wherein the non-volatile memory array comprises a flash memory array.

8. A system, comprising
a processor and a memory device coupled to the processor, the memory device comprising:
  a memory array; and
  a writable non-volatile storage element coupled to the memory array, the non-volatile storage element to hold contents defining operational configuration parameters of the memory device;
  wherein the non-volatile storage element comprises a non-volatile register, each output of the non-volatile register coupled to an input of a volatile storage cell different than the volatile storage cells connected to other non-volatile storage cells.

9. The system of claim 8, further comprising:
a volatile storage element; and
a circuit to store contents of at least a portion of the non-volatile storage element in the volatile storage element upon receipt of a particular signal.

10. The system of claim 9, wherein:
the non-volatile storage element comprises a non-volatile storage array; and
the circuit comprises executable micro-code to read the contents from the non-volatile storage array and store the contents in the volatile storage element.

11. The system of claim 8, wherein the operational configuration parameters comprise indicators of at least one item selected from a list consisting of: 1) a synchronous or asynchronous interface, 2) number of wait states to be observed during operation, 3) polarity of a control signal, 4) width of data to be read at one time from the memory device, 5) polarity of an interrupt signal, and 6) power mode to be implemented.

* * * * *